(12) United States Patent
Tuominen et al.

(10) Patent No.: US 7,673,387 B2
(45) Date of Patent: Mar. 9, 2010

(54) MANUFACTURE OF A LAYER INCLUDING A COMPONENT

(75) Inventors: Risto Tuominen, Helsinki (FI); Petteri Palm, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 370 days.

(21) Appl. No.: 11/659,190

(22) PCT Filed: Aug. 4, 2005

(86) PCT No.: PCT/FI2005/000352

§ 371 (c)(1),
(2), (4) Date: Feb. 2, 2007

(87) PCT Pub. No.: WO2006/013230

PCT Pub. Date: Feb. 9, 2006

(65) Prior Publication Data

US 2008/0295326 A1 Dec. 4, 2008

(30) Foreign Application Priority Data

Aug. 5, 2004 (FI) .................................. 20041059

(51) Int. Cl.
*H01K 3/10* (2006.01)
*H01L 21/00* (2006.01)
(52) U.S. Cl. .............................. 29/852; 29/830; 29/832; 29/840; 438/107; 438/108
(58) Field of Classification Search ................... 29/825, 29/830, 832, 840, 846, 852; 438/107, 118, 438/108
See application file for complete search history.

(56) References Cited

U.S. PATENT DOCUMENTS

| 4,246,595 A | 1/1981 | Noyori et al. |
| 5,248,852 A | 9/1993 | Kumagai |
| 5,497,033 A | 3/1996 | Fillion et al. |

(Continued)

FOREIGN PATENT DOCUMENTS

EP           0 920 058 A      6/1999

(Continued)

*Primary Examiner*—C. J Arbes
(74) *Attorney, Agent, or Firm*—Birch, Stewart, Kolasch & Birch, LLP.

(57) ABSTRACT

A method for manufacturing a circuit-board layer on a base surface (2), which base surface (2) includes conductor patterns (19). The circuit-board layer being manufactured comprises a conductor-pattern layer (14), an insulating layer (1), and at least one component (6) inside the insulating-material layer (1). According to the invention, the component (6) is attached to the conductor layer (4), the conductor layer (4) is aligned relative to the base surface (2) attached with the aid of an insulating material (1) to the base surface (2). An insulating-material layer (1) is thus formed between the conductor layer (4) and the base surface (2), on which the said at least one component (6) is located. Electrical contacts are formed between the contact areas (7) of the component (6) and the conductor layer (4), in such a way that contact openings (17) are opened at the positions of the contact areas (7) of the component (6) and conductive material is made in the contact openings (17). The conductor layer (4) is patterned to form a conductor-pattern layer (14), and at least one via (20) is made between the conductor-pattern layer (14) and the conductor patterns (19) of the base surface (2).

20 Claims, 6 Drawing Sheets

U.S. PATENT DOCUMENTS

| | | | |
|---|---|---|---|
| 6,038,133 | A | 3/2000 | Nakatani et al. |
| 6,154,366 | A | 11/2000 | Ma et al. |
| 6,271,469 | B1 | 8/2001 | Ma et al. |
| 6,284,564 | B1 | 9/2001 | Balch et al. |
| 6,475,877 | B1 | 11/2002 | Saia et al. |
| 6,489,685 | B2 | 12/2002 | Asahi et al. |
| 6,701,614 | B2 | 3/2004 | Ding et al. |
| 6,876,072 | B1 | 4/2005 | Wang et al. |
| 6,991,966 | B2 * | 1/2006 | Tuominen .................. 438/118 |
| 7,294,529 | B2 * | 11/2007 | Tuominen .................. 438/107 |
| 2002/0117743 | A1 | 8/2002 | Nakatani et al. |
| 2003/0159852 | A1 | 8/2003 | Nakamura |
| 2006/0278967 | A1 | 12/2006 | Tuominen et al. |

FOREIGN PATENT DOCUMENTS

| | | |
|---|---|---|
| EP | 1 111 662 A | 6/2001 |
| JP | 2004-146634 | 5/2004 |
| WO | WO-03/065778 A1 | 8/2003 |

* cited by examiner

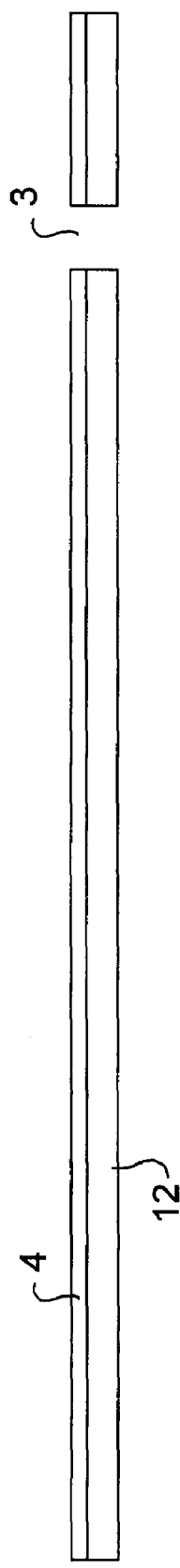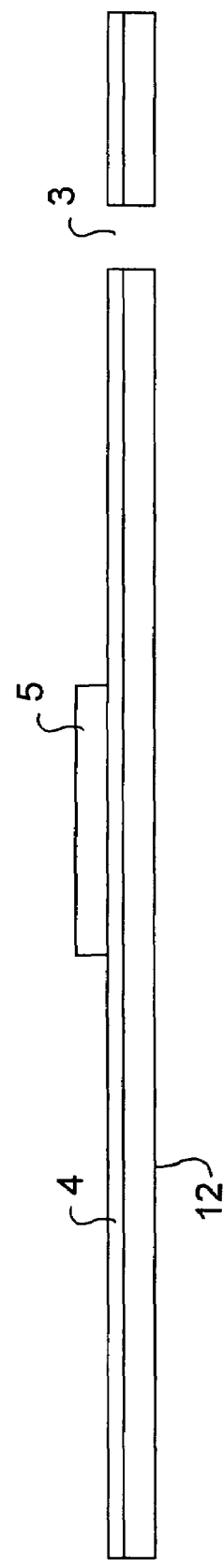
Fig. 1
Fig. 2

MANUFACTURE OF A LAYER INCLUDING A COMPONENT

The present invention relates to a method for manufacturing a layer containing a component.

Layers containing a component are manufactured, for example, when making multi-layer circuit boards or other similar electronic modules. In particular, the method to which the invention relates seeks to manufacture a layer, which contains one or more components, which are connected electrically to a circuit external to the layer, or to each other, through conductor structures made in the electronic module. In this document, such a layer will be referred to as a circuit-board layer.

Patent publication U.S. Pat. No. 6,489,685 discloses one solution, in which components are placed inside a circuit board during the creation of the circuit board. In the solution, conductor patterns are made on top of a support base and the component is connected to the manufactured conductor patterns. After this, an insulating layer, on the surface of which there can be additional conductor-pattern layers, acting as the base material of the circuit board, is formed on top of the conductor patterns and the component. After the creation of the insulating layer, the support base is detached from the construction.

Patent publication U.S. Pat. No. 6,038,133 discloses not only a method similar to that described above, but also a second solution, in which components are placed inside a circuit board during the creation of the circuit board. In the second solution, the components are glued, using an electrically conductive adhesive, to copper foil and after this an insulating layer acting as the base material of the circuit board is formed on top of the copper foil and the component. After forming the insulating layer, conductor patterns are made from the copper foil.

The electrical properties of a contact made with the aid of an electrically conductive adhesive are not particularly good, so that the methods disclosed in the publications U.S. Pat. No. 6,489,685 and U.S. Pat. No. 6,038,133 are not suitable for many such applications, wherein the electrical properties are critical.

The invention is intended to create a new method for manufacturing a circuit-board layer on a base surface, which comprises conductor patterns. In particular, the new method should permit the manufacture of contacts that are reliable and have high-quality electrical properties to the contact bumps or other contact areas of a component.

The invention is based on attaching the component or components of the circuit board being manufactured to a conductor layer, which at this stage has not yet been patterned to form a conductor-pattern layer. The conductor layer is aligned relative to the base surface and attached to the base surface with the aid of an insulating material, in such a way that the component or components face the base surface and the components are located inside the insulating material. The electrical contacts between the contact areas of the component and the conductor-pattern layer are formed in such a way that, at the location of the contact areas of the component, contact openings are opened and a conductor material is formed in the contact openings. The conductor material is manufactured preferably using a chemical and/or electrochemical metallization method. After this, the conductor layer is patterned to form a conductor-pattern layer and the necessary vias are made between the conductor-pattern layer and the conductor patterns of the base surface.

More specifically, the method according to the invention is characterized by what is stated in the characterizing portion of Claim 1.

Considerable advantages are gained with the aid of the invention.

Using the method according to the invention, it is possible to add the desired number of circuit-board layers to the surface of circuit boards or other electronic modules. Using the method according to the invention, circuit-board layer can also be added to other surfaces, which include conductor patterns.

Using the method according to the invention, it is also possible to manufacture high-quality and reliable electrical contacts to the contact bumps or other contact areas of a component. This is based on the fact that, when making the contacts, it is possible to use, for example, some microvia method known in the circuit-board industry and found to be reliable. The contacts can be made, for example, in such a way that the contact areas are first cleaned, for example, with the aid of a laser or plasma and after this metal is grown in the contact openings, using a chemical and/or electrochemical metallization method.

In the following, the invention is examined with the aid of examples and with reference to the accompanying drawings.

FIG. 1 shows a conductor membrane used as a starting material in the manufacture of a circuit-board layer in one embodiment of the invention.

FIG. 2 shows an intermediate stage according to one embodiment, in which a local adhesive layer is added on top of the conductor layer of FIG. 1.

In the methods according to the embodiments, manufacture can start, for example, from a bare conductor layer 4, which can be, for example, a metal layer. Copper foil (Cu) is one material suitable for manufacturing the conductor layer 4. If the conductor membrane 4 selected for the process is very thin, or the conductor membrane is not mechanically durable for other reasons, it is recommended that the conductor membrane 4 be supported with the aid of a support layer 12 (FIG. 1). It is then possible to proceed, for example, in such a way that the process commences from the manufacture of the support layer 12. The support layer 12 can be, for example, of an electrically conductive material, such as aluminium (Al), steel, or copper, or of an insulating material, such as a polymer. On the other side of the support layer 12, it is possible to manufacture an unpatterned conductor layer 4, for example, by using some manufacturing method well known in the circuit-board industry. The conductor layer can be made, for example, by laminating copper foil (Cu) on the surface of the support layer 12. Alternatively, it is possible to proceed in such a way that the support layer 12 is made on the surface of the conductor layer 4. The conductor membrane 4 can also be a surfaced metal membrane, or some other membrane containing several layers or several materials.

Manufacture can also be commenced, for example, from a conductor layer 4, on the first surface of which there is an insulating-material layer 1 (not shown). In that case, the first surface is the surface on that side to which the component, which is enclosed inside the insulating layer 1, is attached. In some embodiments, on the opposite surface to this insulating layer 1 there can be yet another conductor layer 4. If a support layer 12 is used in the embodiment, the support layer 12 will be on the opposite surface of the conductor layer 4, i.e. on the first surface. In that case, holes or recesses are made in the insulating-material layer 1 for the components that are to be embedded. The recesses can be made either before the insulating-material layer 1 and the conductor layer 4 are attached to each other, or else after the attachment. In the manufacture of the recesses, some machining method known in the circuit-board industry, for example milling or laser drilling, can be used.

Figure 3:
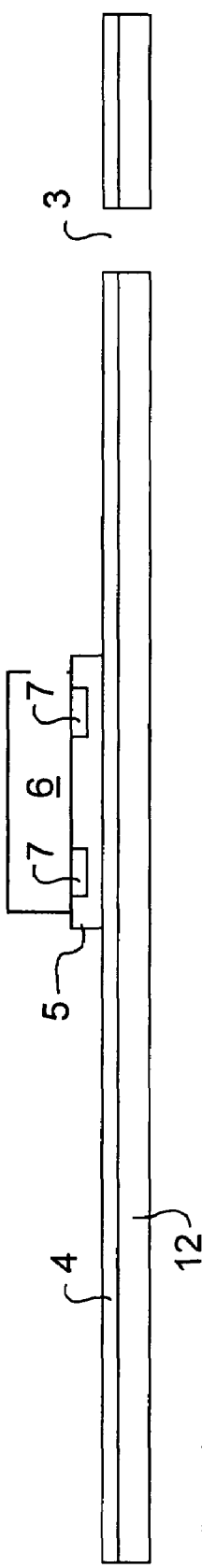
FIG. 3 shows an intermediate stage according to one embodiment, in which a component is glued to the adhesive layer of FIG. 2.
Figure 4:
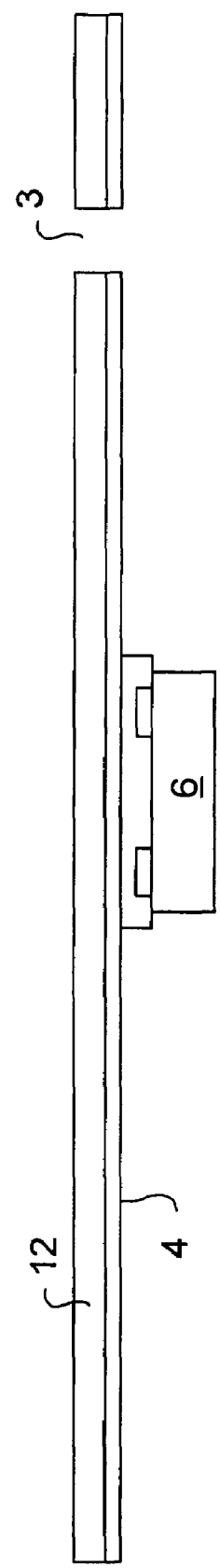
FIG. 4 shows the piece of FIG. 3 turned upside down.
Figure 7:
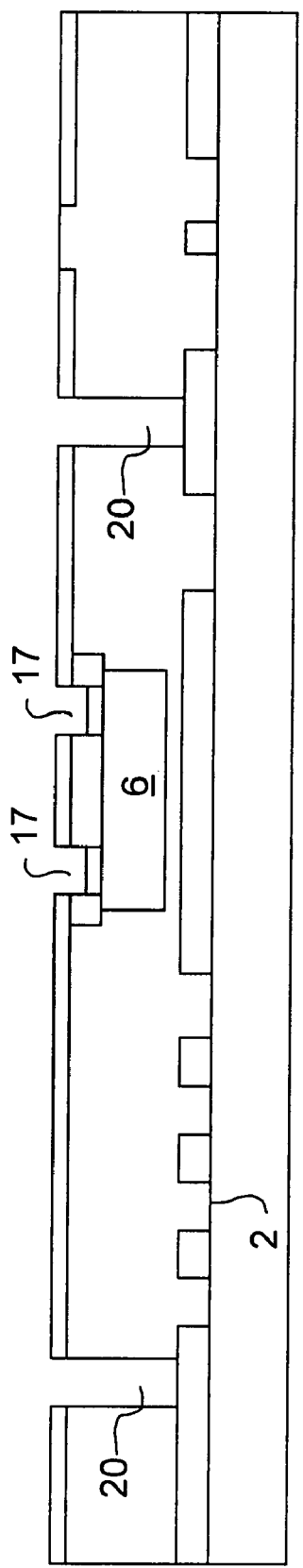
FIG. 7 shows an intermediate stage according to one embodiment, in which the support layer of the conductor layer has been removed and in which contact openings have been made to made contacts to the component and holes for the vias.

In a first embodiment, (not shown in the figures) contact openings are made in the conductor layer 4 at the positions of the contact areas 7 of the component 6 to be attached (compare FIGS. 3 and 7). The contact openings are thus made before the component 6 is attached to the conductor layer. The contact openings can be made, for example, by drilling with the aid of a laser. The mutual positioning of the contact openings is selected according to the mutual positions of the contact areas 7 of the component and the position and alignment of each group of contact openings is selected in such a way that the component is positioned correctly relative to the entire electronic module. In a more conventional embodiment, one contact opening is made for each contact area 7 participating in the creating of each electrical contact, but embodiments also exist, in which several contact openings are made for a single contact area 7. The surface area of the contact openings to be made can be more or less as large as the surface area of the corresponding contact area 7. The surface area of the contact opening can, of course, also be selected to be smaller, or in some embodiments slightly larger than the surface area of the corresponding contact area 7. The shape of the contact openings can be, for example, round, elliptic, oval, angular, or linear.

The contact openings can be drilled from the direction of the first or second surface of the conductor layer. If a support layer 12, which is thus on the second side of the conductor layer, is used in the embodiment, it may be preferable to drill the contact openings from the direction of the first surface, because the openings to be drilled need not then penetrate the support layer 12 completely. In such an embodiment, the contact openings open later, when the support layer 12 is removed. The contact openings can also be opened by thinning the material layer formed by the conductor layer 4 and the support layer 12 by etching it form the direction of the support layer. The conductor layer 4 and the support layer 12 can also be formed from a single material layer. The part of the material layer that corresponds to the support layer 12 is then removed and the contact openings opened. The contact openings are thus intended to extend through the entire conductor layer 4.

In a second embodiment, contacts openings are not made in the conductor layer 4 before the component is attached, instead contact openings 17 are made only after the attachment of the component (FIG. 7). In such an embodiment, suitable alignment marks are used to align the component. In both the first and the second embodiments, alignment openings 3 (FIG. 1) are made in the conductor layer, for the mutual alignment of the circuit-board layer and the conductor structures on the base surface 2. In both embodiments, the alignment openings can be made either before the attachment of the component 6 to the conductor layer, or after the attachment.

In both embodiments, the components 6 are attached to the surface of the conductor layer 4 with the aid of adhesive (FIG. 3). For gluing, an adhesive layer 5 is spread on the attachment surface of the conductor layer 4 or the attachment surface of the component 6, or on both attachment surfaces (FIG. 2). After this, the components 6 can be aligned in the positions planned for the components 6 with the aid of the alignment marks.

The attachment surface of the component 6 refers to that surface of the components 6, which faces towards the conductor layer 4. The attachment surface of the component 6 comprises contact areas, by means of which an electrical contact can be made to the component. The contact areas can be, for example, flat areas on the surface of the component 6, or more usually contact protrusions, such as contact bumps, protruding from the surface of the component 6. Generally there are at least two contact areas or protrusions in a component 6. In complex microcircuits, there can be even a great many contact areas.

Generally it is preferable to spread so much adhesive on the attachment surface or attachment surfaces that the adhesive completely fills the space remaining between the component 6 and the conductor layer 4. There will then be no need for a separate filler agent. The filling of the space remaining between the components 6 and the conductor layer 4 reinforces the mechanical connection between the component 6 and the conductor layer 4, so that a mechanically more durable construction is obtained. A complete adhesive layer with no gaps will also support the conductor patterns 14 to be formed later in the conductor layer 4 and will protect the construction in later process stages. In the first embodiment, the adhesive will also enter the contact openings during gluing.

The term adhesive refers to a material, by means of which the components can be attached to the conductor layer. One property of the adhesive is that it can be spread on the surface of the conductor layer and/or the component in a relatively liquid form, or otherwise in a form that conforms to the surface shapes, for example in the form of a membrane. A second property of the adhesive is that, after spreading, the adhesive hardens, or can be hardened at least partly, in such a way that the adhesive can hold the component in place (relative to the conductor layer) at least until the component is attached to the construction in some other way. A third property of the adhesive is its adhesive ability, i.e. its ability to grip the surface being glued.

The term gluing refers to the attachment of the component and the conductor layer with the aid of an adhesive. When gluing, the adhesive is thus brought between the component and the conductor layer and the component is placed in a suitable position relative to the conductor layer, in which the adhesive is in contact with the component and the conductor layer and at least partly fills the space between the component and the conductor layer. After this, the adhesive is allowed to harden (at least partly), or the adhesive is actively cured (at least partly), in such a way that the component adheres with the aid of the adhesive to the conductor layer. In some embodiments, the contact protrusions of the component may protrude through the adhesive layer during gluing, to make contact with the conductor layer.

The adhesive used in the embodiments is, for example, a filled or unfilled thermosetting epoxy. The adhesive is selected in such a way that the adhesive used has a sufficient adhesion to the conductor membrane, circuit board, and component. One preferred property of the adhesive is a suitable thermal expansion coefficient, so that the thermal expansion of the adhesive will not differ too greatly from the thermal expansion of the surrounding material during the process. The adhesive selected should also preferably have a short hardening time, preferably of a few second at most. Within this time the adhesive should harden at least partly so that the adhesive will be able to hold the components in place. Final hardening can take clearly more time and the final hardening can even be planned to take place in connection with later process stages. The adhesive should also withstand the process temperatures used, for example heating to a temperature of 100-265° C. a few times, as well as other manufacturing-process stress, for example chemical or mechanical stress. The electrical conductivity of the adhesive is preferably in the order of the electrical conductivity of insulating materials.

A suitable insulating-material layer 1 is, selected as the base material of the electronic module, for example, a circuit board. The insulating-material layer 1 can be made from a suitable polymer or a material containing a polymer. The manufacturing material of the insulating-material layer 1 can be, for example, in a liquid or pre-cured form (such as prepreg). Glass-fibre-reinforced sheets, such as FR4 of FR5-type sheets, can be used in the manufacture of the insulating-material layer 1. Other examples of materials, which can be used in the manufacture of the insulating-material layer 1 are PI (polyamide), aramid, polytetrafluoroethylene, and Teflon®. In place of or along with thermosetting plastics, thermoplastics can also be utilized in the manufacture of the insulating-material layer 1, for example, some suitable LCP (liquid crystal polymer).

Figure 5:
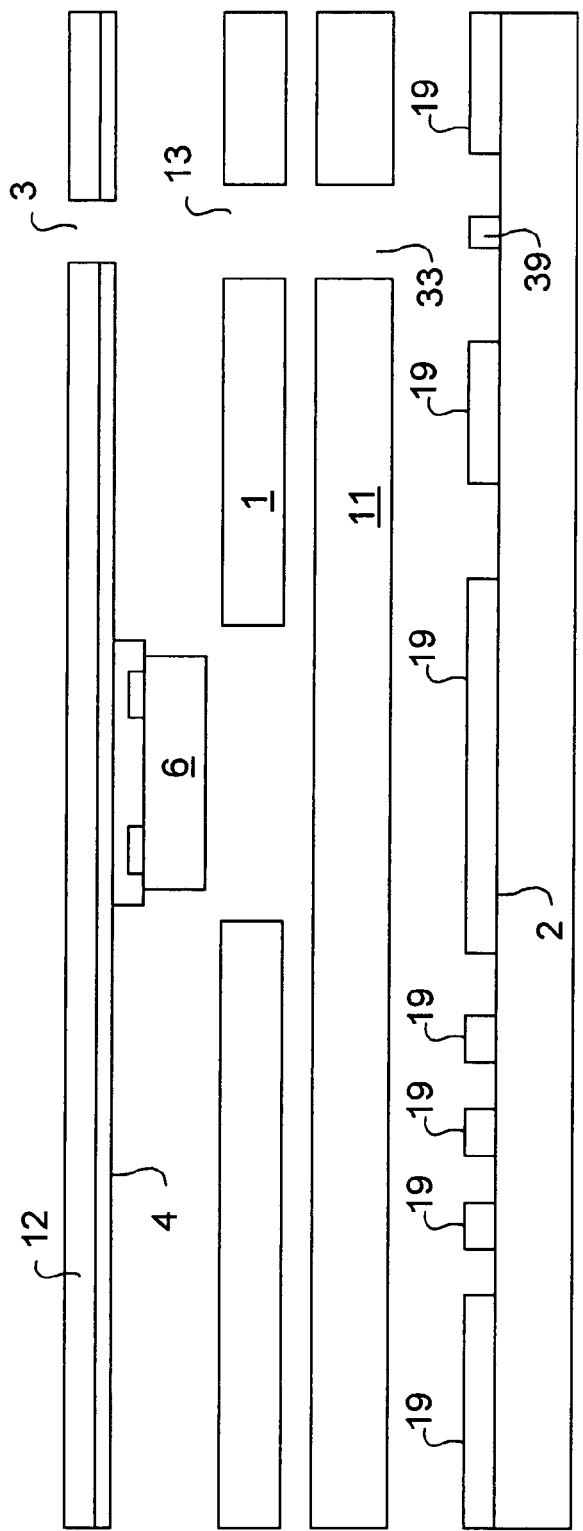
FIG. 5 shows an intermediate stage according to one embodiment, in which the piece of FIG. 4 is being attached to the base surface with the aid of insulating-material layers.

Recesses or through-holes selected according to the size and mutual positions of the components 6 glued to the conductor layer 4 are made in the insulating-material layer 1 using some suitable method (FIG. 5). The recesses or through-holes can also be made slightly larger than the components 6, in which case the alignment of the insulating-material layer 1 relative to the conductor layer 4 will not be so critical. If an insulating-material layer 1, in which through-holes are made for the components 6, is used in the process, certain advantages can be gained by using in addition a separate insulating-material layer 11, in which holes are not made. Such an insulating-material layer 11 can be located on top of the insulating-material layer to cover the through-holes made for the components.

Figure 6:
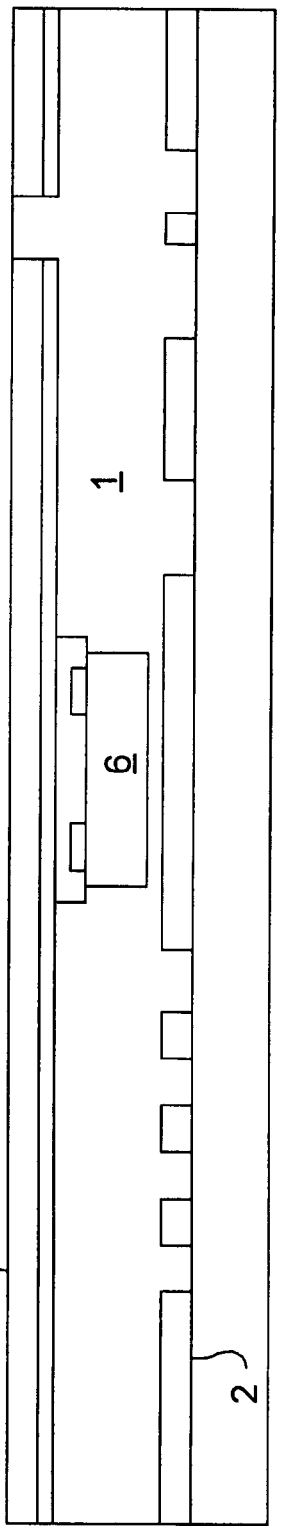
FIG. 6 shows an intermediate stage according to one embodiment, in which the piece of FIG. 4 is attached to the base surface with the aid of an insulating-material layer.

After this, the insulating material is hardened, so that an essentially unified insulating-material layer 1 is created (FIG. 6). The essentially unified insulating-material layer 1 is formed in both the embodiments using a single insulating-material sheet 1 and those using several insulating-material sheets 1, 11.

If the insulating-material layer 1 is not transparent, alignment openings 13 can be made in the insulating-material layer for the mutual alignment of the circuit-board layer and the conductor structures on the base surface 2. This procedure can be used in both the first and second embodiments. In a corresponding manner, when using an insulating-material layer 11, alignment openings 33 can be made in it. The alignment openings 13 and the alignment openings 33 are positioned according to the alignment marks 39 on the base surface. When the insulating material layer 1 or the insulating-material layers 1, 11 are placed on top of the base surface 2 in such a way that the alignment openings 13 and, if necessary, also the alignment openings 33 are set in the same position as the alignment mark 39, the conductor layer 4 can be aligned accurately relative to the base surface 2, through the alignment opening 3. Alignment can also be performed, for example, with the aid of alignment pins located in the edge areas of the entire sheet being aligned.

Another alternative for alignment is to bring the conductor layer 4 into the correct position relative to the base surface 2 by aligning it through an alignment opening 3 and holding the conductor layer 4 in place in the correct position above the base surface 2. After this, an at least partly unhardened insulating-material sheet 1 can be brought between the conductor layer 4 and the base surface 2 and the layers pressed together. If, when pressing, the conductor layer 4 and the base surface 2 are not allowed to move laterally relative to each other, the conductor layer 4 and the base surface 2 will come to the correct position relative to each other. In such an embodiment, the insulating-material layer 1 need not necessarily include alignment openings 13. Correspondingly alignment openings 33 will also not be needed when using a second insulating-material layer 11.

After the attachment of the layers, microvias are made in the electronic module, through which electrical contacts can be made between the contact areas of the components 6 and the conductor layer 4.

For making the vias, the contact openings 17 in the first embodiment are cleaned of adhesive and other materials that may have entered the openings. This naturally takes place from the direction of the second surface of the conductor material 4, as the components are glued to the first side. In connection with the cleaning of the contact openings, it is also possible to clean the contact areas 7 of the components 6, which will further improve the conditions for making a high-quality electrical contact. Cleaning can take place, for example, using a plasma technique, chemically, or with the aid of a laser. If the contact openings and contact areas are already sufficiently clean, cleaning can naturally be omitted.

At this stage in the second embodiment contact openings 17 are made through the conductor layer 4 (FIG. 7). The contact openings 17 are aligned, for example, with the aid of alignment openings 3. The contact openings 17 can be made, for example, with the aid of a laser.

In connection with the manufacture or cleaning of the contact openings 17, it is also possible to make holes for the vias to be formed between the conductor-pattern layer 14 and a conductor structure 19 on the base surface 2.

After this, it is possible to examine the success of the alignment of the component 6, if this is desired. This is based on the fact that well aligned contact areas 7 of a component 6 will be visible through the contact openings 17 when viewed from the direction of the conductor layer 4.

Figure 8:
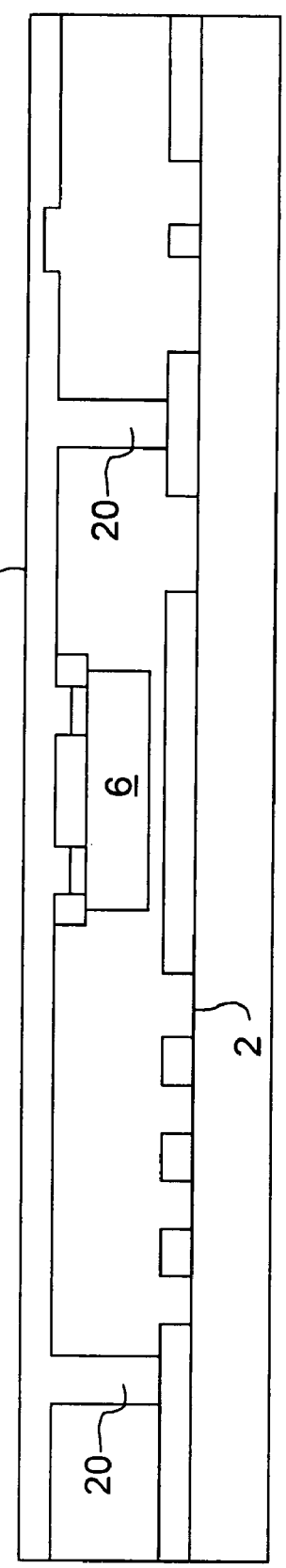
FIG. 8 shows an intermediate stage according to one embodiment, in which conductor material is made on top of the contact openings, vias, and conductor layer of FIG. 7.

After the contact openings have been cleaned in the first embodiment (if this is necessary), or, in the second embodiment after the contact openings have been made, conductive material is brought to the contact openings 17, in such a way that it forms an electrical contact between the component 6 and the conductor layer 4. In the same connection, it is possible to make conductors also to the vias 20. The conductive material can be made, for example, by filling the contact openings with an electrically conductive paste. The conductive material can also be made by using some of the growing methods known in the circuit-board industry. At the present moment, best electrical contacts are made by creating a metallurgical joint, for example, by growing the conductive material using a chemical or electrochemical method. Such methods are thus attempted to be used in at least the most demanding applications. One good alternative is the growth of a thin layer using a chemical method and continuing the growth using a more economical electrochemical method. In addition to these methods, it is of course possible to also use some other method, which is of benefit in terms of the final result. At the same time, the thickness of the conductor layer 4 can also be increased (FIG. 8).

Figure 9:
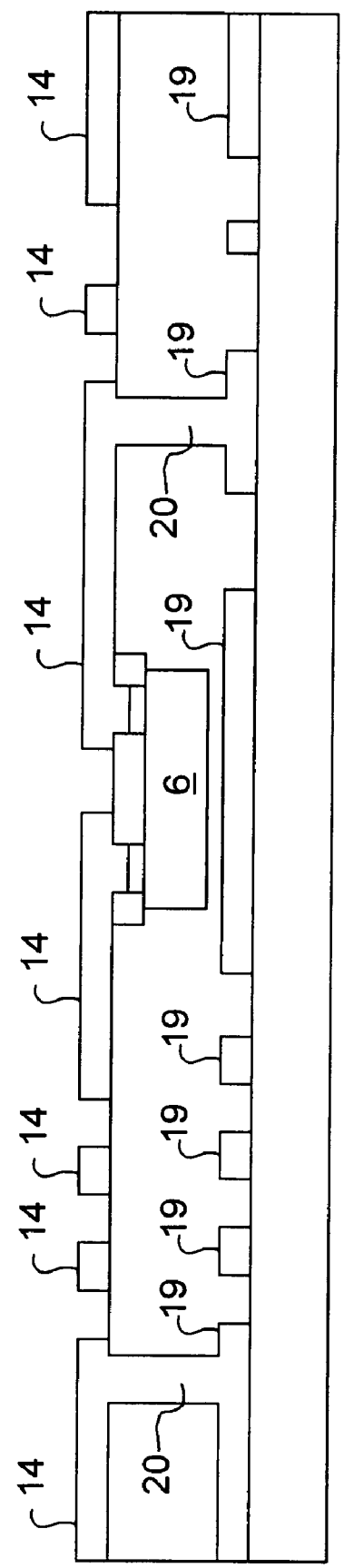
FIG. 9 shows a piece according to one embodiment, in which the conductor layer on the surface of the piece shown in FIG. 8 is patterned to form a conductor-pattern layer.

After this, the conductor layer 4 can be patterned to form a conductor-pattern layer 14 (FIG. 9).

When manufacturing a circuit-board layer according to the first embodiment, it is also possible to exploit in the manufacture of the circuit-board layer the manufacturing method that is disclosed in the same applicant's Finnish patent application number 20030493, which was filed on 1 Apr. 2003 and which had still not been published by the priority date of the present patent application.

When manufacturing a circuit-board layer according to the second embodiment, it is also possible to exploit in the manufacture of the circuit-board layer the manufacturing method that is disclosed in the same applicant's Finnish patent application number 20040827, which was filed on 15 Jun. 2004 and which had still not been published by the priority date of the present patent application.

The examples described above depict some of the possible processes, which the aid of which our invention can be exploited. However, our invention is not restricted to only the first and second embodiments described above, but instead the invention also covers other different processes and their end products, taking into account the full extent and equivalence interpretation of the Claims. The invention is also not restricted to only the constructions and methods depicted by the examples, but it will be obvious to one versed in the art that various applications of our invention can be used to manufacture a great variety of electronic modules and circuit boards, which differ even greatly from the examples presented. The components and circuits of the figures are thus shown only with the intention of illustrating the manufacturing process. Thus a great many changes can be made to the processes of the examples described above, while nevertheless not deviating from the basic idea according to the invention. The changes can relate, for example, to the manufacturing techniques described in the various stages, or to the mutual sequence of the process stages.

Figure 10:
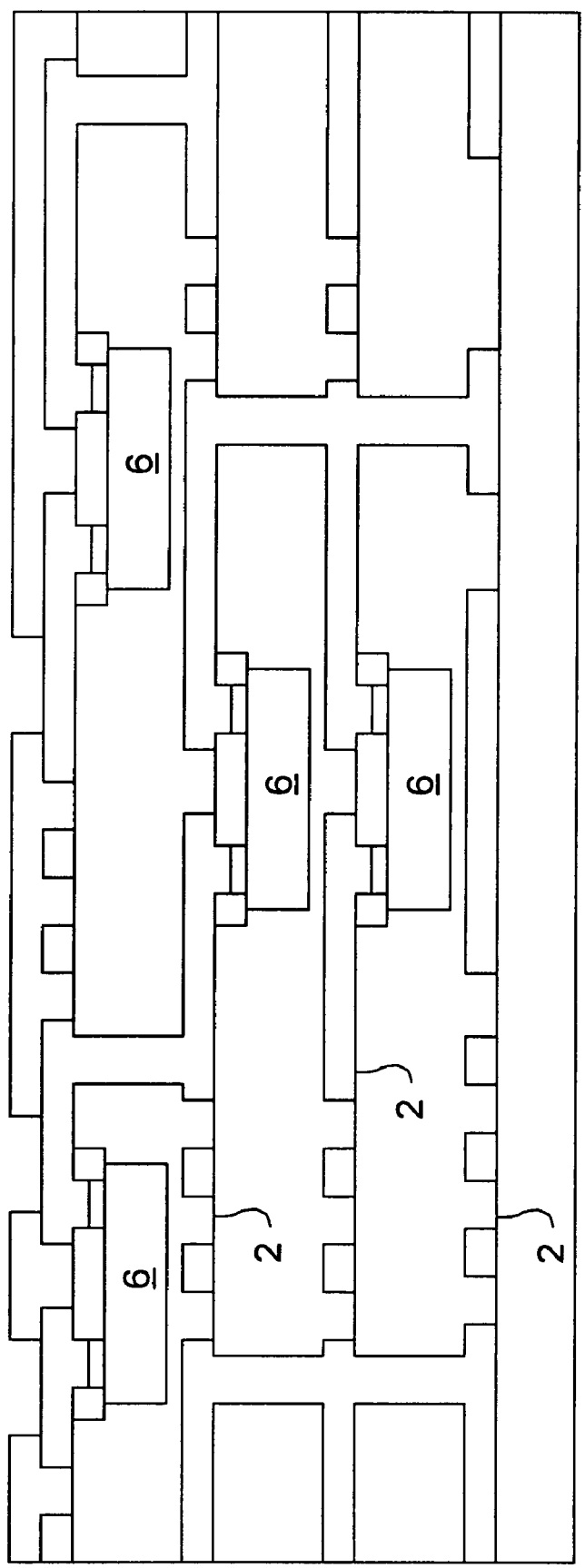
FIG. 10 shows an electronic module according to one embodiment, in which three circuit-board layers have been made on top of each other on the base surface.

The circuit-board layer manufacturing method described above can also be repeated, in such a way that circuit-board layers are made on top of each other. In this way it is possible to manufacture, for example, constructions like that shown in FIG. 10, which comprise circuit-board layers on top of each other, connected to each other electrically, which contain components.

Circuit-board layers can thus be added on top of very different base surfaces 2. The base surface 2 can also be a curved surface, as in the embodiments presented above the electrical contact between the component and the related conductor layer will not be damaged due to the bending of the conductor layer. This is based on the fact that the electrical contact is made only after the bending of the conductor layer.

The invention claimed is:

1. A method for manufacturing a circuit-board layer on a base surface the base surface including conductor patterns, and the circuit-board layer including a conductor pattern layer, an insulating-material layer, and inside the insulating-material layer at least one component, the method comprising:
   providing a conductor layer with contact openings positioned according to the contact areas of the at least one component;
   after providing the contact openings, attaching said at least one component to the conductor layer, on the side of a first surface of the conductor layer with the contact areas facing the contact openings in the conductor layer;
   aligning the conductor layer relative to the base surface and attaching the conductor layer with the aid of an insulating material to the base surface, the first surface of the conductor layer facing towards the base surface, thereby forming the insulating-material layer between the conductor layer and the base surface, said at least one component being located in said insulating-material layer;
   forming electrical contacts between the contact areas of the component and the conductor layer through the contact openings in the conductor layer, wherein the forming includes making conductive material in the contact openings;
   patterning the conductor layer to form a conductor-pattern layer; and
   making at least one via between the conductor-pattern layer and the conductor patterns of the base surface.

2. The method according to claim 1, wherein the base surface is the surface of a circuit board.

3. The method according to claim 1, further comprising:
   attaching the component, to the conductor layer with the aid of an insulating adhesive; and
   after the attachment forming the electrical contact between the conductor layer and the contact areas, by making vias through the insulating adhesive.

4. The method according to claim 3, wherein the step of forming the electrical contacts between the contact areas of the component and the conductor layer is performed after said step of attaching the conductor layer to the base surface with the aid of insulating material.

5. The method according to claim 1, wherein the step of making the conductive material in the contact openings comprises using a chemical metallization method and/an electrochemical metallization method.

6. The method according to claim 1, further comprising:
   providing the conductor layer with second openings for alignment; and
   aligning the component with the aid of the second openings when attaching the component to the conductor layer.

7. The method according to claim 1, further comprising:
   providing the conductor layer with at least one third opening for making the at least one via, prior to attaching the component the conductor layer includes openings for making vias.

8. The method according to claim 1, wherein the base surface includes alignment marks for said alignment of the conductor layer, relative to the base surface.

9. The method according to claim 1, wherein said attachment of the conductor layer to the base surface comprises;
   bringing at least one insulating-material sheet, which is at least partly unhardened, between the base surface and the first surface of the conductor layer.

10. The method according to claim 9, wherein the at least one insulating-material sheet includes fourth openings made for alignment.

11. The method according to claim 1, wherein the conductor layer is attached to the base surface with the aid of one insulating material such that the formed insulating-material layer is unified and consists of the single one insulating-material; between the conductor layer and the base surface.

12. The method according to claim 1, wherein the insulating-material layer between the conductor layer and the base surface is formed after the attachment of the component, and the conductor patterns are formed from the conductor layer after the formation of the insulating-material layer.

13. The method according to claim 1, wherein the formed insulating material surrounds the component and comes into contact with the surface of the component.

14. The method according to claim 1, wherein said at least one component comprises a plurality of components in the circuit-board layer, and the method further comprises combining the plurality of components with the aid of the conductor-pattern layer to form an electrically functional totality.

15. The method according to claim 1, wherein the base surface is a curved surface.

16. The method according to further comprising:
repeating the steps of claim 1 in order to manufacture a second circuit-board layer on top of the first circuit-board layer made on the base surface, wherein the surface of the first circuit-board layer acts as the base surface for the second circuit-board layer.

17. The method according to claim 1, wherein making the conductive material in the contact openings and making of the at least one via comprises filling the contact openings and at least one via with the conductive material simultaneously using the same process step.

18. The method according to claims 1, wherein making the at last one via comprises making conductive material using a chemical metallization method and an electrochemical metallization method.

19. The method according to claim 1, wherein the at least one component comprises at least one microcircuit.

20. The method according to claim 1, wherein the at least one component comprises contact bumps on the contact areas, the contact bumps forming part of the electrical contacts formed between the contact areas and the conductor layer.

* * * * *